United States Patent [19]
Mizumoto et al.

[11] 4,446,439
[45] May 1, 1984

[54] FREQUENCY/VOLTAGE CONVERSION CIRCUIT

[75] Inventors: Kastuji Mizumoto; Katsuhiko Yaguchi, both of Saitama, Japan

[73] Assignee: Pioneer Electronic Corporation, Tokyo, Japan

[21] Appl. No.: 357,130

[22] Filed: Mar. 11, 1982

[30] Foreign Application Priority Data

Mar. 13, 1981 [JP] Japan .................................. 56-36964

[51] Int. Cl.³ .............................................. H03K 9/06
[52] U.S. Cl. ..................................... 328/140; 307/519
[58] Field of Search ......................... 328/140; 307/519

[56] References Cited

U.S. PATENT DOCUMENTS

| | | | |
|---|---|---|---|
| 3,529,247 | 9/1970 | Nelson | 307/519 |
| 3,591,858 | 7/1971 | Boyd | 328/140 |
| 3,723,771 | 3/1973 | McLean | 307/519 |
| 4,245,192 | 1/1981 | Whiffen | 328/140 |

Primary Examiner—John S. Heyman
Attorney, Agent, or Firm—Sughrue, Mion, Zinn, Macpeak & Seas

[57] ABSTRACT

A frequency/voltage conversion circuit is provided with a detection circuit for determining when the input frequency rises above a predetermined level which threatens to inhibit operation of flip-flop devices in the circuit. In response to the detection, a capacitor of a first charging/discharging circuit is forcibly charged to a value above a predetermined level.

9 Claims, 2 Drawing Figures

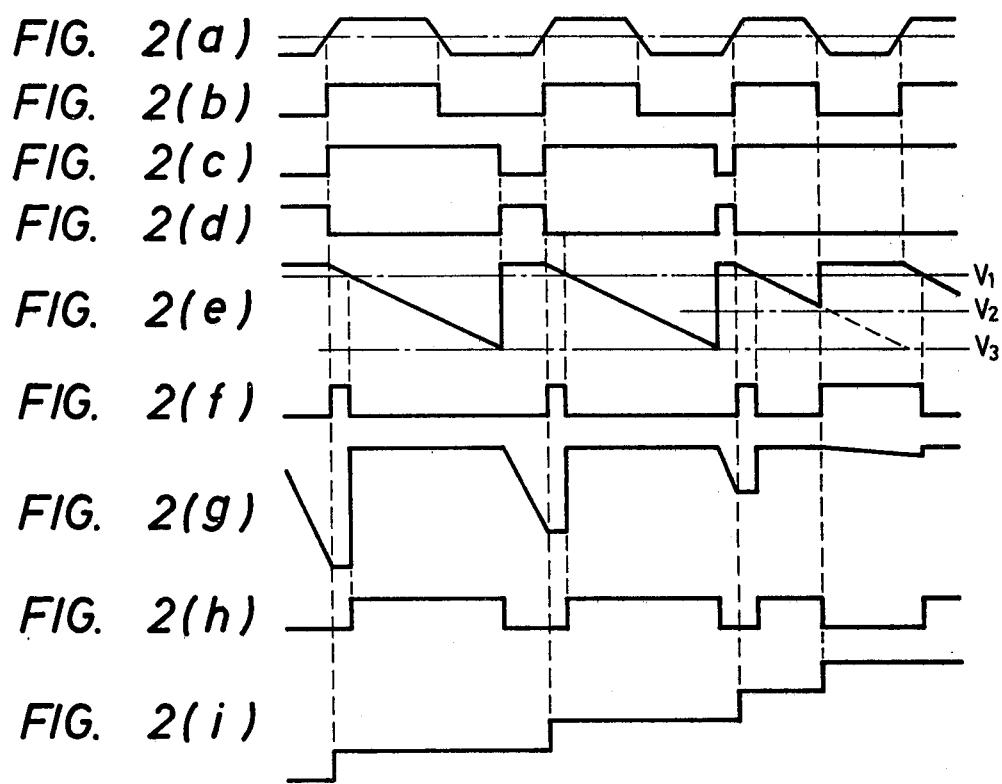

FREQUENCY/VOLTAGE CONVERSION CIRCUIT

BACKGROUND OF THE INVENTION

This invention relates to a frequency/voltage conversion circuit used for producing a voltage in accordance with the frequency of a given signal.

When motors are subjected to constant-speed control, the control is carried out in such a manner that a frequency proportional to the number of revolutions of the motor is produced, the thus obtained frequency is converted into a DC voltage, and then a difference voltage between this DC voltage and a reference voltage is fed back. A frequency/voltage conversion circuit is employed in such constant-speed control systems to convert the frequency into a DC voltage.

In the prior art, for example, a frequency/voltage conversion circuit is known which is arranged such that a pulse signal is generated which has a period in accordance with the frequency of a given signal, and there is provided a Flip-Flop which is set upon the rising of the pulse signal. A first capacitor starts to discharge upon the rising of the pulse signal, and a hold signal and first reset signal are generated in accordance with the voltage across the first capacitor while the Flip-Flop is set. The Flip-Flop is reset by a further reset signal when the voltage across the first capacitor reaches a predetermined level, and a second capacitor is provided which starts to discharge when the Flip-Flop is reset, and charge in response to the first reset signal. The voltage across the second capacitor is sampled and held in response to the hold signal, so as to be output as a DC voltage.

In the frequency-voltage conversion circuit of this arrangement, a time constant is determined so that the first capacitor completes its discharging within one period of the input signal having a frequency less than the predetermined frequency. However, if the frequency of the input signal exceeds the predetermined frequency during the start-up of the motor, or due to fluctuations in the load or disturbances while rotating in the stationary state, the period of the pulse signal would become shorter and shorter, whereas the first capacitor, which starts to discharge upon the rising of the pulse signal, has a constant discharge time. Finally, the rising of the next pulse would come on before the potential at the first capacitor reaches the predetermined reference level, and at that time the first capacitor would start to discharge again, thus resulting in a state where the potential at the first capacitor reaches the predetermined reference level during a lapse of the generated pulse. This leads to a drawback such that the Flip-Flop is brought into an input inhibition state with both set and reset inputs being raised to the high level, and hence the operation thereof becomes unstable.

SUMMARY OF THE INVENTION

It is an object of this invention to provide a frequency/voltage conversion circuit which can perform in a stable manner irrespective of fluctuations in frequency.

BRIEF DESCRIPTION OF THE DRAWINGS

In the following, a preferred embodiment of this invention will be described in more detail with reference to the drawings, in which:

FIGS. 2(a)–2(i) are wave form diagrams for explaining the operation of the circuit of FIG. 1.

DETAILED DESCRIPTION OF THE PREFERRED EMBODIMENTS

Figure 1:
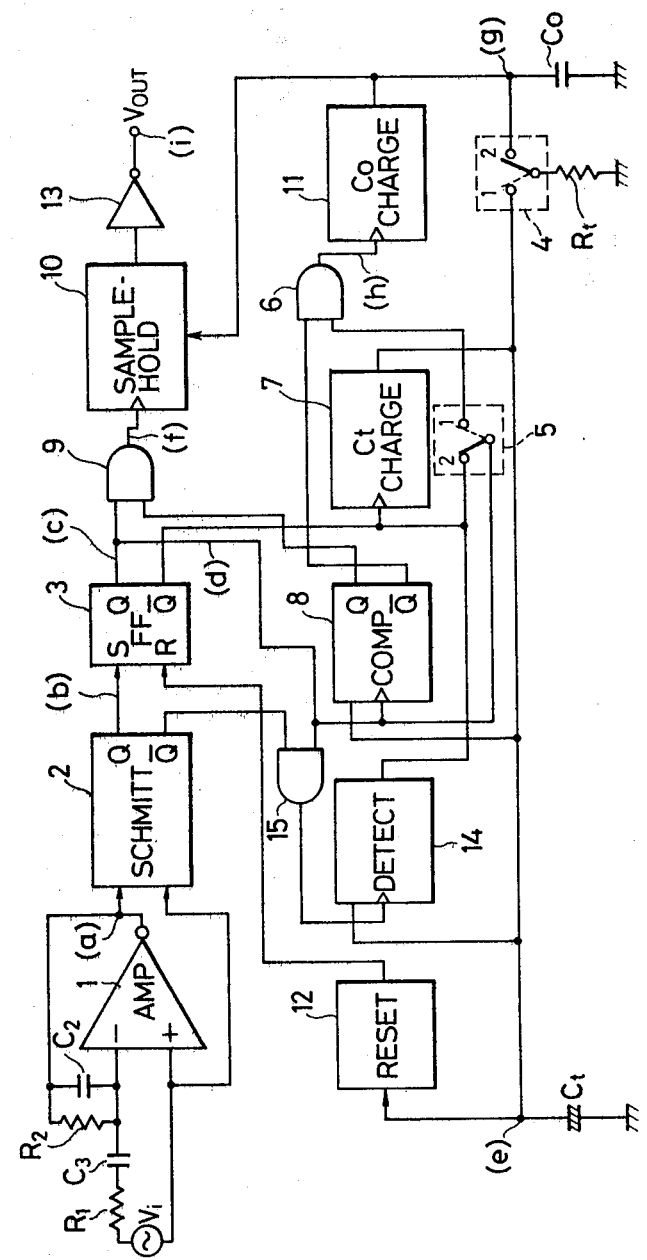
FIG. 1 is a block diagram illustrating one embodiment of this invention.

FIG. 1 is a block diagram showing one embodiment of the present invention. Referring to FIG. 1, a signal $v_i$ having a frequency proportional to the rotational speed (or the number of revolutions) of a motor, for example, is input to an amplifier 1 via a resistor $R_1$ and a capacitor $C_1$ connected serially. An output terminal of the amplifier 1 issues a signal having a wave form as illustrated in FIG. 2(a). While being fed back to an inverted input terminal of the amplifier 1 via a resistor $R_2$ and a capacitor $C_2$ connected in parallel, the signal issued by the amplifier 1 is shaped into a square wave pulse signal (b) by a Schmitt circuit 2, and then becomes the set input for a Flip-Flop (hereinafter referred to as FF) 3. The FF3 is set upon the rising of the pulse signal (b) so as to generate a Q output (c) and a $\bar{Q}$ output (d), respectively.

There are provided two switching means 4 and 5 which are set to the side of the fixed contacts 1 thereof while the FF 3 is set, and which are switched to the side of fixed contacts 2 thereof while the FF 3 is reset. As to the switching means 4, the fixed contacts 1 and 2 are connected to output terminals of capacitors $C_t$ and $C_o$, respectively, whereas the movable contact thereof is grounded via a resistor $R_t$. By selecting one of the two fixed contacts, either the capacitor $C_t$ or $C_o$ is discharged. On the other hand, with respect to the switching means 5, the fixed contact 1 is connected to one input terminal of the AND gate 6 and the fixed contact 2 is connected to an input terminal of a $C_t$ charging circuit 7 (described hereafter), respectively, whereas its movable contact is supplied with the Q output (c) from the FF 3. Well known electronic switches comprising transistors, etc. can be used as the switching means 4 and 5.

When the FF 3 is set upon the rising of the pulse signal (b), the energy having been stored in the capacitor $C_t$ starts to be discharged via the resistor $R_t$, so that the potential at the output terminal of the capacitor $C_t$ is lowered with a certain time constant as illustrated in FIG. 2(e). A comparison circuit 8, which receives this output voltage (e) of the capacitor $C_t$ as the compared input, is activated in response to the Q output (c) from the FF 3, to thereby issue a Q output at a high level when the output voltage (e) of the capacitor $C_t$ is higher than a reference level $V_1$, and a Q output at a high level when the output voltage (e) is lower than the reference level $V_1$. Both Q outputs from the FF 3 and the comparison circiut 8 are input to an AND gate 9, which in turn issues a hold pulse (f). In response to the hold pulse (f), a sample-hold circuit 10 sample-holds the output voltage (g) of the capacitor $C_o$ at that time. Meanwhile, the AND gate 6 receiving the $\bar{Q}$ output from the comparison circuit 8 as the other input thereto issues a reset pulse (h). A $C_o$ charging circuit 11 allows the capcitor $C_o$ to start charging in response to the reset pulse (h).

When the capacitor $C_t$ continues to discharge and the output voltage (e) thereof reaches a reference level $V_2$, a reset circuit 12 resets the FF 3. Upon reset of the FF 3, the switching means 4 is switched to make it possible for the capacitor $C_t$ to stop its discharge, and then the $C_t$ charging circuit 7 begins charging the capacitor $C_t$ in response to the $\bar{Q}$ output of the FF 3. At the same time, the reset pulse (h) is extinguished upon the switching of the switching means 5, whereby the $C_o$ charging circuit 11 stops the charging of the capacitor $C_o$. The capacitor $C_o$ starts to discharge via the resistor $R_t$, upon inversion of the switching means 4.

The foregoing operation will be repeated for each period of the pulse signal (b) with the result that the sample hold circuit 10 samples-holds the output voltage (g) of the capcitor $C_o$ at that time in response to the hold pulse (f). The output of the sample hold circuit 10 becomes the DC voltage $V_{out}$ (i), in accordance with frequency of the input signal $v_i$, through a buffer 13.

With such an arrangement, the time constant for charging the above capacitor $C_t$ is determined so that the capacitor $C_t$ completes its discharging within one period of predetermined frequency. However, if the frequency of the input signal $v_i$ were to exceed the predetermined frequency, the circuit would become unstable in its operation for the reason stated above. Therefore, according to this invention, there is provided a detection circuit 14 for detecting whether or not the frequency of the input signal $v_i$ reaches the frequency at which the aforesaid unstable operation will be caused, to thereby render the operation of the circuit stable, utilizing the output of the detection circuit 14.

More specifically, the detection circuit 14 judges, at a certain time in each period of the pulse signal (b), for example at the falling of the pulses, that the frequency of the input signal $v_i$ is higher than the above predetermined frequency, when the output voltage (e) of the capacitor $C_t$ does not reach a reference level $V_3$ (lower than the reference level $V_2$) corresponding to the above predetermined frequency (FIG. 2). Upon this judgement, the $C_t$ charging circuit 7 is activated so as to forcedly start charging of the capacitor $C_t$. At this time, the detection timing with the detection circuit 14 is determined by the output from an AND gate 15 which receives an inverted output ($\overline{Q}$ output) of the Schmitt circuit 2 and the Q output of the FF 3 as the two inputs thereto. The detection circuit 14 may comprise, for example, a well known analog switch which receives the output voltage of the capacitor $C_t$ and turns ON in response to an output from the AND gate 15, and a comparator adapted to issue an output therefrom when an output voltage of the analog switch (the output voltage of the capacitor $C_t$) exceeds the above reference level $V_3$, thus activating the $C_t$ charging circuit. At a result, the capacitor $C_t$ continues to charge until the inverted output of the Schmitt circuit 2 is extinguished.

In such a manner, the capacitor $C_t$ is forcedly charged when the frequency of the input signal $v_i$ becomes higher than the predetermined frequency, so that there does not occur an input inhibition state of the FF 3 where both the set and reset signals are input to the FF 3 at the same time. Thus, the operation of the circuit is stabilizied and the output voltage (g) of the capacitor $C_o$ is always sampled at a substantially charged level. Consequently, with the frequency/voltage conversion circuit according to this invention used in a constant-speed control for a motor, the output voltage of the capacitor $C_o$ can be sampled at a substantially charged level even when the frequency of the input signal, which frequency is proportional to the number of revolutions of the motor, exceeds the predetermined frequency during the start-up of the motor or due to fluctuations in load or disturbance while rotating. Thus, a control current may be supplied to the motor without interruption, while avoiding occurrences of unstable operation or motor runaway.

Although, in the foregoing embodiment, the capacitor $C_t$ discharges while the FF 3 is set and charges while it is reset, and the capacitor $C_o$ discharges while the FF 3 is reset and charges in response to the reset pulse, it is also possible to modify the system into the reverse arrangement such that the capacitor $C_t$ charges while the FF 3 is set and discharges while reset, and the capacitor $C_o$ charges while the FF 3 is reset and discharges in response to the set pulse.

What is claimed is:

1. A frequency/voltage conversion circuit, comprising; a pulse generation circuit for generating a pulse signal having a period in accordance with a frequency of a given signal; a Flip-Flop being set by said pulse signal; a first charging/discharging circuit which discharges while said Flip-Flop is set, and which charges in response to a control signal; means for providing said control signal to said first charging/discharging circuit when said Flip-Flop is reset; means for resetting said Flip-Flop; and a detecting circuit for monitoring the charge level of said first charging/discharging circuit and for outputting a detection signal when the charge level of said first charging/discharging circuit does not reach a predetermined reference level at a predetermined time in each period of said pulse signal; means for providing said control signal in response to said detection signal, whereby said first charging/discharging circuit is forcedly charged in response to said detection signal.

2. A frequency/voltage conversion circuit as claimed in claim 1, said resetting means comprising a reset circuit for resetting said Flip-Flop when the output voltage of said first charging/discharging circuit reaches a second reference level lower than said predetermined level.

3. A frequency/voltage conversion circuit as claimed in claim 2, further including a signal generation circuit for generating a hold signal and a reset signal in accordance with the output voltage of said first charging/discharging circuit while said Flip-Flop is set.

4. A frequency/voltage conversion circuit as claimed in claim 3, further comprising a second charging/discharing circuit discharging in response to the output from said reset circuit, and charging in response to said reset signal.

5. A frequency/voltage conversion circuit as claimed in claim 4, further including a circuit for sample-holding an output voltage of said second charging/discharing circuit in response to said hold signal, an output voltage of said circuit being obtained as a converted voltage.

6. A frequency/voltage conversion circuit as claimed in claim 5, including comparison circuit means receiving the output voltage of said first charging/discharging circuit, said comparison circuit outputting a first signal when the output voltage is higher than a third reference level higher than said predetermined reference level.

7. A frequency/voltage conversion circuit as claimed in claim 6, including AND means receiving an output from said Flip-Flop and said output of said comparison circuit, and issuing said hold signal in response thereto.

8. A frequency/voltage conversion circuit as claimed in claim 7, including further AND means receiving a second output signal from said comparison circuit when the output voltage of said first charging/discharging circuit is lower than said second reference level, and being operable to output said reset signal in response thereto, and a charging circuit operating in response to said reset signal for charging said second charging/discharging circuit.

9. A frequency/voltage conversion circuit as claimed in claim 1, further including switching circuit means operating in response to said Flip-Flop for controlling charging and discharging of said first charging/discharging circuit.

* * * * *